(12) United States Patent
Camacho et al.

(10) Patent No.: US 8,404,524 B2
(45) Date of Patent: Mar. 26, 2013

(54) INTEGRATED CIRCUIT PACKAGING SYSTEM WITH PADDLE MOLDING AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 131 days.

(21) Appl. No.: 12/884,073

(22) Filed: Sep. 16, 2010

(65) Prior Publication Data
US 2012/0068318 A1  Mar. 22, 2012

(51) Int. Cl.
*H01L 21/00* (2006.01)

(52) U.S. Cl. ......... 438/121; 438/123; 257/676; 257/666

(58) Field of Classification Search .................. 257/666, 257/676, 784, 787; 438/111, 121, 123, 127
See application file for complete search history.

(56) References Cited

U.S. PATENT DOCUMENTS

| | | | |
|---|---|---|---|
| 6,380,048 B1 | 4/2002 | Boon et al. | |
| 6,498,099 B1 * | 12/2002 | McLellan et al. | 438/689 |
| 6,635,957 B2 * | 10/2003 | Kwan et al. | 257/691 |
| 6,661,083 B2 | 12/2003 | Lee et al. | |
| 7,067,908 B2 | 6/2006 | Jang | |
| 7,582,957 B2 | 9/2009 | Tay | |
| 7,671,463 B2 | 3/2010 | Camacho et al. | |
| 2006/0186517 A1 * | 8/2006 | Jang | 257/676 |
| 2008/0079127 A1 * | 4/2008 | Gerber | 257/676 |
| 2009/0230524 A1 | 9/2009 | Chien et al. | |
| 2011/0079888 A1 * | 4/2011 | Bathan et al. | 257/676 |
| 2011/0140250 A1 * | 6/2011 | Lee | 257/670 |
| 2011/0193208 A1 * | 8/2011 | Xue et al. | 257/676 |
| 2011/0227208 A1 * | 9/2011 | Kim et al. | 257/676 |
| 2011/0266662 A1 * | 11/2011 | Hsia et al. | 257/676 |
| 2012/0007225 A1 * | 1/2012 | Hasebe et al. | 257/676 |
| 2012/0018865 A1 * | 1/2012 | Camacho et al. | 257/676 |
| 2012/0018867 A1 * | 1/2012 | Toda et al. | 257/676 |

* cited by examiner

*Primary Examiner* — S. V. Clark
(74) *Attorney, Agent, or Firm* — Ishimaru & Associates LLP (57) ABSTRACT

A method of manufacture of an integrated circuit packaging system includes: providing a package paddle having a hole, a recess, and a pad, the hole over the recess; mounting an integrated circuit to the package paddle; forming a lead having a bottom surface coplanar with a bottom surface of the pad, the lead isolated from the package paddle; attaching connectors directly on the integrated circuit, the lead, and the package paddle; and forming an encapsulation covering the integrated circuit and within the hole and the recess.

20 Claims, 4 Drawing Sheets

INTEGRATED CIRCUIT PACKAGING SYSTEM WITH PADDLE MOLDING AND METHOD OF MANUFACTURE THEREOF

TECHNICAL FIELD

The present invention relates generally to an integrated circuit packaging system, and more particularly to a system for encapsulation.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for increased density and structural integrity. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package paddle having a hole, a recess, and a pad, the hole over the recess; mounting an integrated circuit to the package paddle; forming a lead having a bottom surface coplanar with a bottom surface of the pad, the lead isolated from the package paddle; attaching connectors directly on the integrated circuit, the lead, and the package paddle; and forming an encapsulation covering the integrated circuit and within the hole and the recess.

The present invention provides an integrated circuit packaging system, including: a package paddle having a hole, a recess, and a pad, the hole over the recess; an integrated circuit mounted to the package paddle; a lead having a bottom surface coplanar with a bottom surface of the pad, the lead isolated from the package paddle; connectors directly on the integrated circuit, the lead, and the package paddle; and an encapsulation covering the integrated circuit and within the hole and the recess.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Some applications require an electrically connected but physically separated die-attach paddle (DAP) and ground (GND) or power bar/ring. This presents a problem of solder creeping onto an etched copper (Cu) between the DAP and the ring. The solder creeping is undesirable. The present invention solves the problem associated with the solder creeping.

Figure 1:
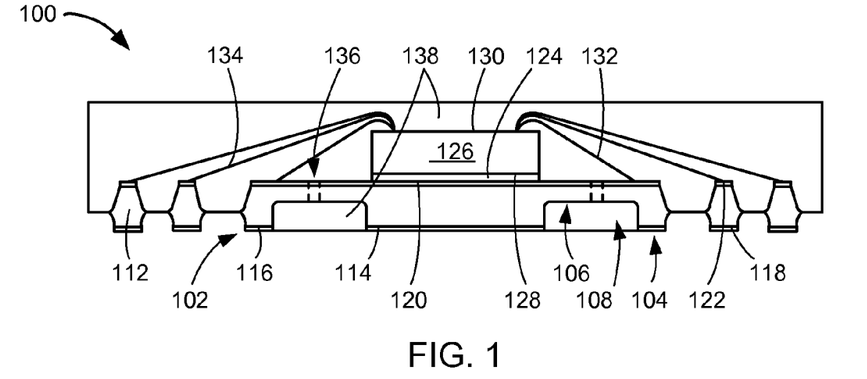
FIG. 1 is a cross-sectional view of an integrated circuit packaging system along a section line 1-1 of FIG. 2 in an embodiment of the present invention.
Figure 2:
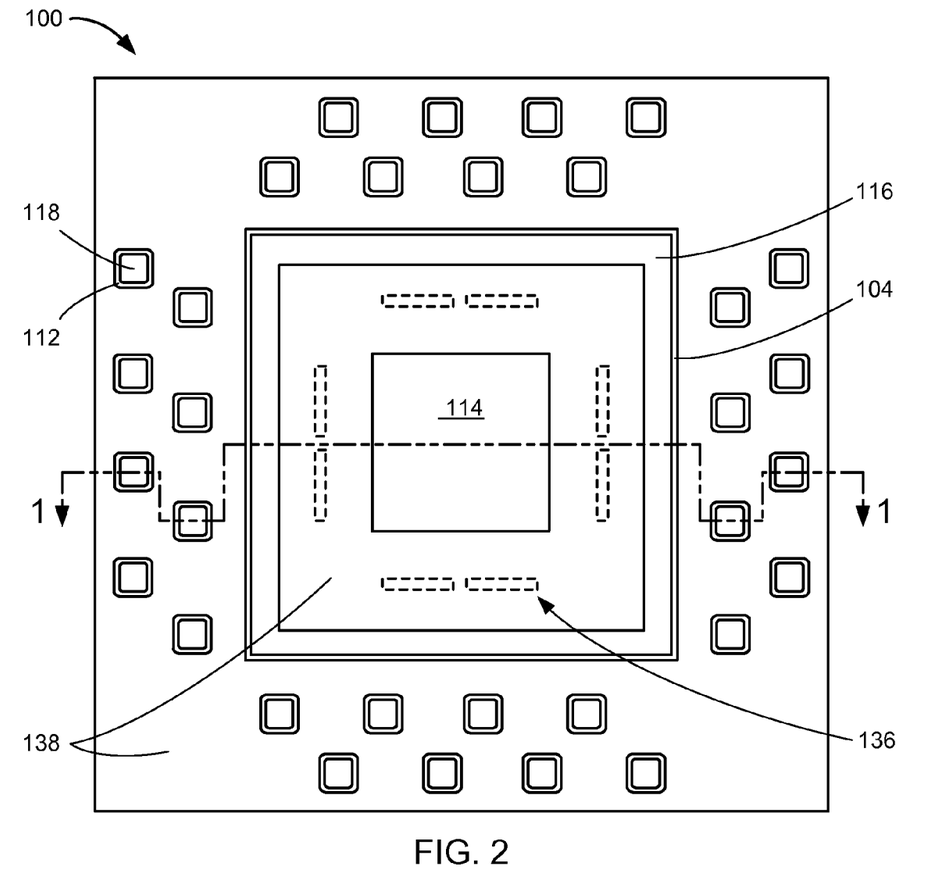
FIG. 2 is a bottom view of the integrated circuit packaging system.

Referring now to FIG. 1, therein is shown a cross-sectional view of an integrated circuit packaging system 100 along a section line 1-1 of FIG. 2 in an embodiment of the present invention. The integrated circuit packaging system 100 can include a package paddle 102, which is used to mount and connect an electrical device. The package paddle 102 can include a pad 104, which provides a connection region for electrical levels such as power or ground. The pad 104 can have a spacing from a center of the package paddle 102.

The package paddle 102 can include a connection portion 106, which connects the pad 104 and an interior portion of the package paddle 102. The connection portion 106 can be integral with the interior portion of the package paddle 102 and the pad 104. The interior portion of the package paddle 102, the pad 104, and the connection portion 106 can preferably be formed of a common material having characteristics of being formed as a single integral structure.

The connection portion 106 can be formed between the interior portion of the package paddle 102 and the pad 104. The connection portion 106 can be electrically connected to the interior portion of the package paddle 102 and the pad 104. The connection portion 106 can have a recess 108. The recess 108 can be bounded by sides of the interior portion of the package paddle 102 and the pad 104.

The integrated circuit packaging system 100 can include a lead 112, which provides electrical connectivity to external systems. The lead 112 can be adjacent the pad 104. The pad 104 can be between the connection portion 106 and the lead 112. The lead 112 can have a bottom surface coplanar with a bottom surface of the pad 104. The lead 112 can be isolated from the pad 104 of the package paddle 102.

The package paddle 102 can include a paddle external layer 114 and a pad external layer 116, which provide electrical contacts for connectivity to external systems. The paddle external layer 114 and the pad external layer 116 can be directly on and electrically connected to bottom portions of the interior portion of the package paddle 102 and the pad 104, respectively. The paddle external layer 114 and the pad external layer 116 are separated from each other by the recess 108.

The lead 112 can include a lead external layer 118, which provides an electrical contact for connectivity to external systems. The lead external layer 118 can be directly on and electrically connected to a bottom portion of the lead 112.

The package paddle 102 can include a paddle internal layer 120, which provides an electrical contact for connecting an electrical device thereto as well as a layer for mounting the electrical device thereover. The paddle internal layer 120 can be directly on and electrically connected to top portions of the interior portion of the package paddle 102, the pad 104, and the connection portion 106.

The lead 112 can include a lead internal layer 122, which provides an electrical contact for connecting an electrical device thereto. The lead internal layer 122 can be directly on and electrically connected to a top portion of the lead 112.

The integrated circuit packaging system 100 can include an attach layer 124, which attaches the paddle internal layer 120 and an integrated circuit 126, which is the electrical device. The attach layer 124 can be a die attach material or an adhesive material. The integrated circuit 126 can include an inactive side 128 and an active side 130 opposite to the inactive side 128. The attach layer 124 can be attached to the inactive side 128.

The integrated circuit 126 can be mounted over a portion of the paddle internal layer 120 that is over the package paddle 102. For illustrative purposes, the integrated circuit 126 is shown as a wirebond integrated circuit, although it is understood that the integrated circuit 126 can be any other electrical devices.

The integrated circuit packaging system 100 can include a pad-device connector 132, which electrically connects the paddle internal layer 120 and the active side 130 of the integrated circuit 126. The pad-device connector 132 can be attached directly on the paddle internal layer 120 and the active side 130. For illustrative purposes, the pad-device connector 132 is shown as a bond wire, although it is understood that the pad-device connector 132 can be any conductive connector.

The integrated circuit packaging system 100 can include a lead-device connector 134, which electrically connects the lead internal layer 122 and the active side 130 of the integrated circuit 126. The lead-device connector 134 can be attached directly on the lead internal layer 122 and the active side 130. For illustrative purposes, the lead-device connector 134 is shown as a bond wire, although it is understood that the lead-device connector 134 can be any conductive connector.

The package paddle 102 can have a hole 136. The hole 136 can be through the connection portion 106 and the paddle internal layer 120. The hole 136 can be over the recess 108.

The integrated circuit packaging system 100 can include an encapsulation 138, which covers a semiconductor package to seal electrical devices providing mechanical and environmental protection. The encapsulation 138 can be a cover including an encapsulant or a mold material.

The encapsulation 138 can be formed over top portions of the package paddle 102, the pad 104, the connection portion 106, and the lead 112. The encapsulation 138 can cover the paddle internal layer 120, the lead internal layer 122, the attach layer 124, the integrated circuit 126, the pad-device connector 132, and the lead-device connector 134.

The encapsulation 138 can be formed within the hole 136 and the recess 108. The encapsulation 138 can partially expose the pad 104 and the lead 112. Lower portions of the pad 104 and the lead 112 can be exposed from the encapsulation 138.

The encapsulation 138 can be formed with at least half of the lead 112 having a conical shape in the encapsulation 138. The encapsulation 138 can be formed with at least half of the pad 104 having a conical shape in the encapsulation 138.

The lead 112 can protrude from the encapsulation 138. The encapsulation 138 can have a bottom surface that is substantially coplanar with bottom surfaces of the paddle external layer 114 and the pad external layer 116.

The present invention can include a stand-off quad flat nolead (QFN) with mold penetration at a bottom side to function as a solder resist. The mold penetration at the bottom side can also function as a die pad interlocking feature to effectively resolve any paddle drop-off problem, which is prevalent for a quad flat nolead sawn stand-off (QFNs-st) package type. The present invention can also include a quad flat nolead sawn stand-off multiple row package (QFNs-st-mr).

It has been discovered that the present invention provides the encapsulation 138 filled through the hole 136 preventing creeping of solder in the recess 108. The encapsulation 138 formed within the recess 108 prevents solder creep in a manner similar to a solder resist.

It has also been discovered that the encapsulation 138 within the recess 108 provides an interlocking feature that eliminates paddle drop-off problems.

It has been unexpectedly found that the recess 108 filled with the encapsulation 138 provides a significantly improved connection for the package paddle 102, at least due to elimination of solder creep. It has been unexpectedly observed that the present invention provides physical isolation between the pad 104 and a bottom portion of the package paddle 102.

Referring now to FIG. 2, therein is shown a bottom view of the integrated circuit packaging system 100. The pad external layer 116 can be formed having a structure of a bar or a ring. The pad external layer 116 can surround the paddle external layer 114. The pad external layer 116 can be isolated from the paddle external layer 114 by a portion of the encapsulation 138.

The hole 136, as shown with dash rectangles, can be between the paddle external layer 114 and the pad external layer 116. For illustrative purposes, the hole 136 is shown having a shape of a slot, although it is understood that the hole 136 can have any shape. The slot has a length greater than a width. The slot can also be predetermined to allow the encapsulation 138 to be filled or to flow through. Also for illustrative purposes, the bottom view is shown with multiple slots, although it is understood that there can be any number of the hole 136.

A portion of the pad 104 can be exposed from the encapsulation 138. The lead 112 with the lead external layer 118 directly thereon can be formed in a peripheral array surrounding the pad 104.

For illustrative purposes, the lead 112 having the lead external layer 118 is shown in staggered rows, although it is understood that the lead 112 can be formed in any other multi-row configuration. Also for illustrative purposes, the pad external layer 116 is shown having a contiguous shape of a ring, although it is understood that the pad external layer 116 can be formed in any shape that is non-contiguous including having multiple sections, shapes, or regions. The ring is formed with multiple connected sides surrounding the paddle external layer 114 with each of the connected sides having a contiguous shape of a bar.

In other embodiments, the present invention can be formed without the need for plating. For example, the present invention can be formed without the paddle external layer 114, the pad external layer 116, the lead external layer 118, the paddle internal layer 120, and the lead internal layer 122.

Figure 3:
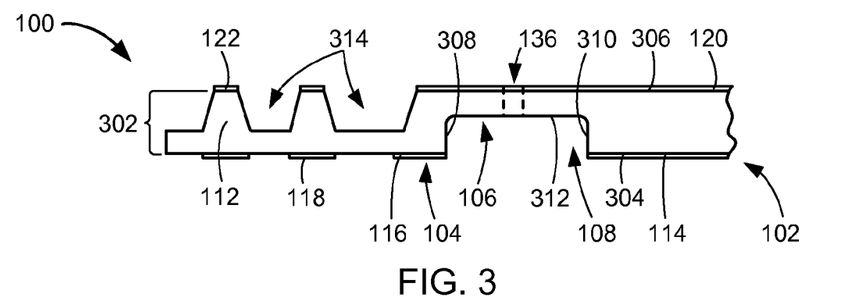
FIG. 3 is a cross-sectional view of a portion of the integrated circuit packaging system along the section line 1-1 of FIG. 2 in a first removal phase of manufacture.

Referring now to FIG. 3, therein is shown a cross-sectional view of a portion of the integrated circuit packaging system 100 along the section line 1-1 of FIG. 2 in a first removal phase of manufacture. A leadframe 302 (LF) preferably includes a leadframe bottom side 304 and a leadframe top side 306 opposite the leadframe bottom side 304. For example, the leadframe 302 can be formed with an electrically conductive material including copper (Cu) or any other metallic material.

The paddle external layer 114, the pad external layer 116, and the lead external layer 118 can be formed directly on the leadframe bottom side 304. The paddle external layer 114, the pad external layer 116, and the lead external layer 118 can be formed by a pre-plated leadframe (PPF) plating process for providing electrical connections. The paddle external layer 114, the pad external layer 116, and the lead external layer 118 can be formed with a conductive material or a metal alloy including nickel (Ni), palladium (Pd), gold (Au), or any combination thereof.

The lead external layer 118 can be adjacent the pad external layer 116. The pad external layer 116 can be between the paddle external layer 114 and the lead external layer 118. A portion of the leadframe 302 at the leadframe bottom side 304 can be removed to form the recess 108. The recess 108 can be bounded by a pad side 308 of the pad 104, a paddle side 310 of the interior portion of the package paddle 102, and a connection bottom side 312 of the connection portion 106. For example, the portion of the leadframe 302 at the leadframe bottom side 304 can be removed with a removal process including a bottom half-etch.

The paddle internal layer 120 and the lead internal layer 122 can be formed directly on the leadframe top side 306. The paddle internal layer 120 and the lead internal layer 122 can be formed by a pre-plated leadframe (PPF) plating process for providing electrical connections. The paddle internal layer 120 and the lead internal layer 122 can be formed with a conductive material or a metal alloy including nickel (Ni), palladium (Pd), gold (Au), or any combination thereof. The lead internal layer 122 can be adjacent the paddle internal layer 120.

The package paddle 102 can have the hole 136. The hole 136 can be through the connection portion 106 and the paddle internal layer 120. The hole 136 can be over the recess 108. The hole 136 can be between the pad side 308 and the paddle side 310. The hole 136 can be formed by applying a mask layer and partially removing the connection portion 106 and the paddle internal layer 120.

Portions of the leadframe 302 at the leadframe top side 306 can be removed to form a partially removed top region 314. For example, the portions of the leadframe 302 at the leadframe top side 306 can be removed with a removal process including a top half-etch.

The leadframe 302 preferably includes the partially removed top region 314 defining top portions of the pad 104 and the lead 112. For example, the integrated circuit packaging system 100 can include a removal process including an etching process to remove upper portions of the leadframe 302 at the leadframe top side 306 to form the partially removed top region 314.

Any portion of the leadframe 302 that is preferably not removed can be plated by a pre-plated leadframe (PPF) plating process. The portion of the leadframe 302 that is preferably not removed can be plated with a conductive material or a metal alloy including nickel (Ni), palladium (Pd), gold (Au), or any combination thereof.

For example, the conductive material or the metal alloy that is used for plating can be resistant to removal methods including etching. Also for example, the leadframe 302 can be provided in a form of a strip with etches of the leadframe 302 preferably not removed by plated using the PPF plating process.

Figure 4:
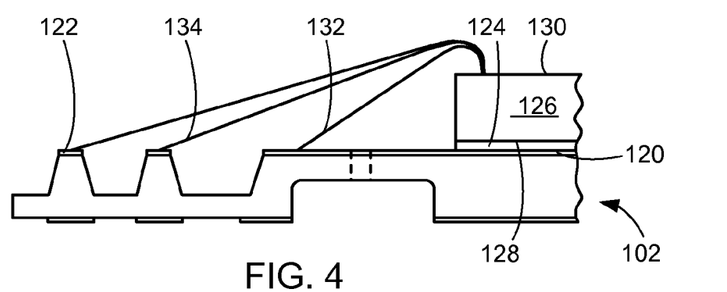
FIG. 4 is the structure of FIG. 3 in a connecting phase.

Referring now to FIG. 4, therein is shown the structure of FIG. 3 in a connecting phase. The integrated circuit 126 can be attached with any die attach (DA) method. The attach layer 124 can be attached to the paddle internal layer 120 and the inactive side 128 of the integrated circuit 126. The integrated circuit 126 can be attached to a portion of the paddle internal layer 120 that is over the package paddle 102.

The integrated circuit 126 can be connected with any interconnection method including wire bonding (WB). The pad-device connector 132 can be connected to the paddle internal layer 120 and the active side 130 of the integrated circuit 126. The lead-device connector 134 can be connected to the lead internal layer 122 and the active side 130 of the integrated circuit 126.

Figure 5:
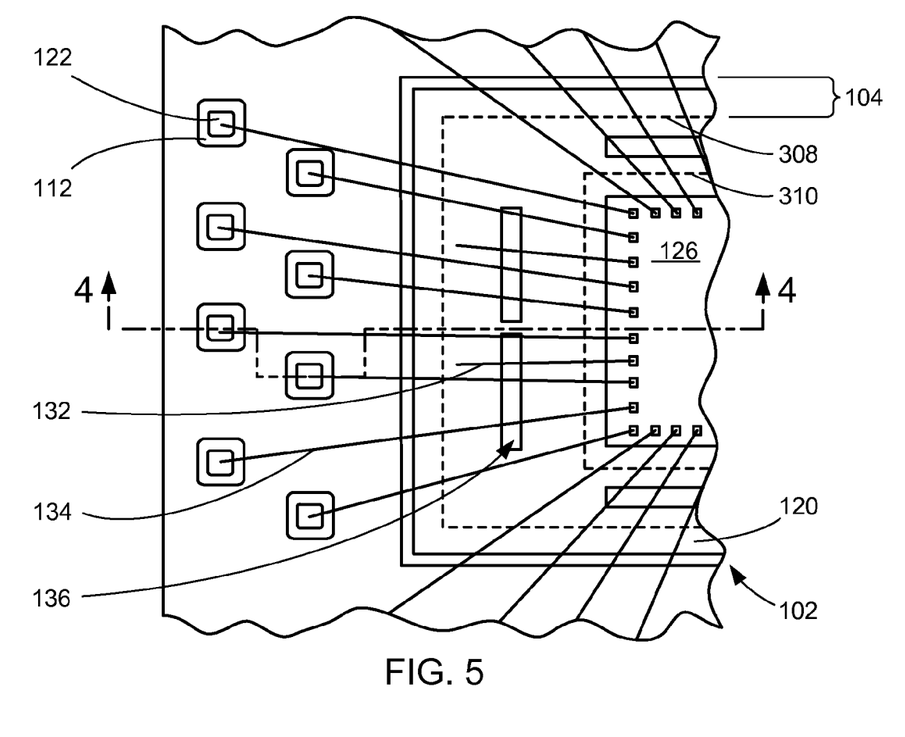
FIG. 5 is a top view of the structure of FIG. 4.

Referring now to FIG. 5, therein is shown a top view of the structure of FIG. 4. The top view is shown with the lead 112 having the lead internal layer 122 with a periphery smaller than that of the lead 112. The lead 112 can be formed along a side of the pad 104.

For illustrative purposes, the lead 112 is shown in multiple, staggered rows, although it is understood that the lead 112 can be formed in different configurations. Also for illustrative purposes, the lead 112 and the lead internal layer 122 are shown in a shape of a square, although it is understood that the lead 112 and the lead internal layer 122 can have any other shapes.

The paddle internal layer 120 can have a periphery smaller than that of the pad 104. The hole 136 can be through the paddle internal layer 120. The hole 136 can be between the pad side 308 and the paddle side 310. The hole 136 can be along any number of the pad side 308 and the paddle side 310. There can be any number of the hole 136 surrounding the package paddle 102.

For illustrative purposes, the hole 136 is shown having a shape of a slot, although it is understood that the hole 136 can have any shape. The slot has a length greater than a width. The slot can also be predetermined to allow the encapsulation 138 of FIG. 1 to be filled or to flow through. Also for illustrative purposes, the top view is shown with multiple slots, although it is understood that there can be any number of the hole 136.

The integrated circuit 126 can have a periphery smaller than that of the package paddle 102. The integrated circuit 126 can be connected to the paddle internal layer 120 with the pad-device connector 132. The integrated circuit 126 can be connected to the lead internal layer 122 with the lead-device connector 134.

Figure 6:
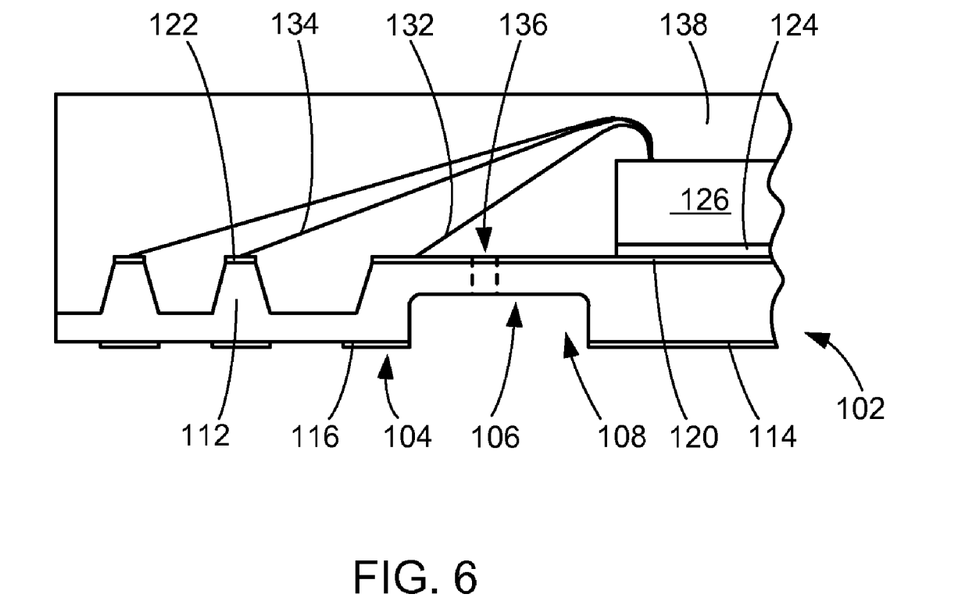
FIG. 6 is the structure of FIG. 4 in a molding phase.

Referring now to FIG. 6, therein is shown the structure of FIG. 4 in a molding phase. The encapsulation 138 can be formed over top portions of the package paddle 102, the pad 104, the connection portion 106, and the lead 112. The encapsulation 138 can cover the paddle internal layer 120, the lead internal layer 122, the attach layer 124, the integrated circuit 126, the pad-device connector 132, and the lead-device connector 134.

The encapsulation 138 can be formed to penetrate the recess 108 by using the hole 136. The encapsulation 138 can be filled through the hole 136 such that the encapsulation 138 can be formed within the recess 108. The encapsulation 138 can be filled within the hole 136. The encapsulation 138 can have a bottom surface substantially coplanar with bottom surfaces of the paddle external layer 114 and the pad external layer 116.

Figure 7:
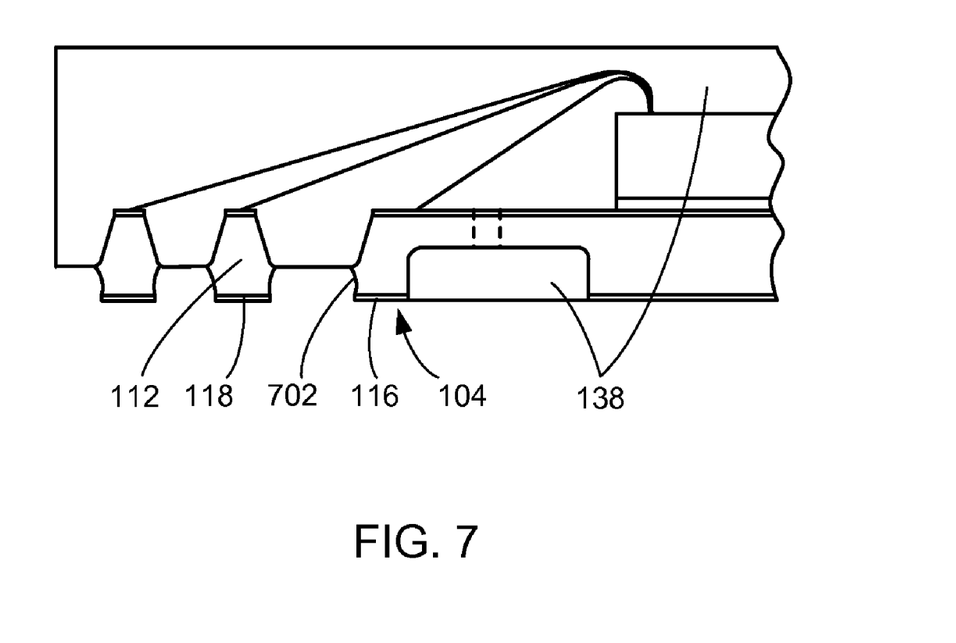
FIG. 7 is the structure of FIG. 6 in a second removal phase.

Referring now to FIG. 7, therein is shown the structure of FIG. 6 in a second removal phase. The second removal phase can include any removal method including strip etch. Additional portions of the leadframe 302 of FIG. 3 at the leadframe bottom side 304 of FIG. 3 can be removed to form the pad 104 and the lead 112.

The additional portions that are not plated with the pad external layer 116 or the lead external layer 118 can be removed. With the additional portions removed, the lead 112 can be isolated from another of the lead 112 and the pad 104 can be isolated from the lead 112.

The encapsulation 138 can partially expose the pad 104 and the lead 112. A non-horizontal side 702 of the pad 104 can be exposed from the encapsulation 138. The lead 112 can have a robust structure with a lower portion of the lead 112 exposed from the encapsulation 138 to function as a stand-off and an upper portion of the lead 112 encapsulated by the encapsulation 138.

The encapsulation 138 in the recess 108 can be partially filled in the recess 108. In other words, the pad 104 can protrude from the encapsulation 138.

Figure 8:
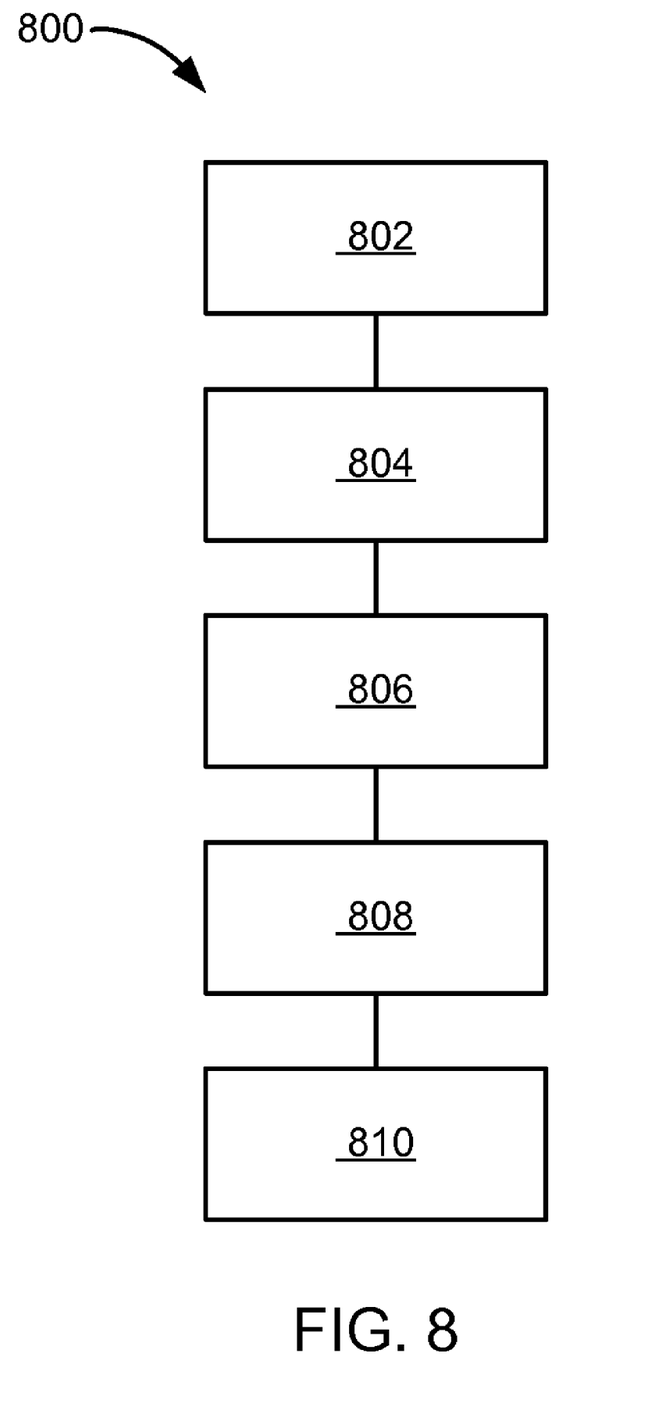
FIG. 8 is a flow chart of a method of manufacture of the integrated circuit packaging system in a further embodiment of the present invention.

Referring now to FIG. 8, therein is shown a flow chart of a method 800 of manufacture of the integrated circuit packaging system 100 in a further embodiment of the present invention. The method 800 includes: providing a package paddle having a hole, a recess, and a pad, the hole over the recess in a block 802; mounting an integrated circuit to the package paddle in a block 804; forming a lead having a bottom surface coplanar with a bottom surface of the pad, the lead isolated from the package paddle in a block 806; attaching connectors directly on the integrated circuit, the lead, and the package paddle in a block 808; and forming an encapsulation covering the integrated circuit and within the hole and the recess in a block 810.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a package paddle, the package paddle having a paddle external layer, and a pad adjacent the package paddle, the pad having pad external layer,
wherein the package paddle and the pad are connected via a connection portion, the connection portion forming a recess between the package paddle and the pad, and
wherein paddle external layer and the pad external layer are coplanar and separated by the recess:
forming a hole in the connection portion, wherein the hole extends therethrough the connection portion and into the recess;
mounting an integrated circuit to the package paddle;
forming a lead having a bottom surface coplanar with a bottom surface of the pad, the lead isolated from the package paddle;
attaching connectors directly on the integrated circuit, the lead, and the package paddle; and
forming an encapsulation covering the integrated circuit and within the hole and the recess.

2. The method as claimed in claim 1 wherein forming the hole includes forming the hole as a slot.

3. The method as claimed in claim 1 wherein forming the encapsulation includes forming the encapsulation with at least had of the lead in the encapsulation.

4. The method as claimed in claim 1 wherein forming the encapsulation includes forming the encapsulation with at least half of the pad in the encapsulation.

5. The method as claimed in claim 1 wherein providing the package paddle includes providing the package paddle having the paddle external layer surrounded by the pad external layer.

6. A method of manufacture of an integrated circuit packaging system comprising:
providing a package paddle, the package paddle having a paddle external layer, and a pad adjacent the package paddle, the pad having a pad external layer,
wherein the package paddle and the pad are connected via a connection portion, the connection portion forming a recess between the package paddle and the pad, and
wherein the paddle external layer and the pad external layer are coplanar and separated by the recess:
forming a hole in the connection portion, wherein the hole extends therethrough the connection portion and into the recess;
mounting an integrated circuit to the package paddle;
forming a lead having a bottom surface coplanar with a bottom surface of the pad, the lead isolated from the package paddle;
attaching a pad-device connector directly on the inter the package paddle;
attaching a lead-device connector directly on the integrated circuit and the lead; and
forming an encapsulation coving the integrated circuit and within the hole and the recess.

7. The method as claimed in claim 6 wherein forming the hole includes forming the hole as multiple slots.

8. The method as claimed in claim 6 wherein forming the encapsulation includes forming the encapsulation with at least half of the lead having a conical shape in the encapsulation.

9. The method as claimed in claim 6 wherein for min the encapsulation includes forming the encapsulation with at least half of the pad having a conical shape in the encapsulation.

10. The method as claimed in claim 6 wherein:
providing the package paddle includes providing the package paddle having the paddle external layer surrounded by the pad external layer; and
forming the encapsulation includes the encapsulation coplanar with the pad external layer.

11. An integrated circuit packaging system comprising:
a package paddle having a paddle external layer,
a pad adjacent the package paddle, the pad having a pad external layer,
wherein the pad and the package paddle are connected via a connection portion, the connection portion configured to provide a recess between the pad and the package paddle, and
where the paddle external layer and the pad external layer are coplanar and separated recess:
a hole formed in the connection portion, wherein the hole extends therethrough the connection portion and into the recess:
an integrated circuit mounted to the package paddle;
a lead having a bottom surface coplanar with a bottom surface of the pad, the lead isolated from the package paddle;
connectors directly on the integrated circuit, the lead, and the package paddle; and
an encapsulation covering the integrated circuit and within the hole and the recess.

12. The system as claimed in claim 11 wherein the hole is formed as a slot.

13. The system as claimed in claim 11 wherein the encapsulation is formed with at least half of the lead in the encapsulation.

14. The system as claimed in claim 11 wherein the encapsulation is formed with at least half of the pad in the encapsulation.

15. The system as claimed in claim 11 wherein the package paddle includes the paddle external layer surrounded by the pad external layer.

16. The system as claimed in claim 11 wherein the connectors includes:
a pad-device connector directly on the integrated circuit and the package paddle; and
a lead-device connector directly on the integrated circuit and the lead.

17. The system as claimed in claim 16 wherein the hole is formed as multiple slots.

18. The system as claimed in claim 16 wherein the encapsulation is formed with at least half of the lead having a conical shape in the encapsulation.

19. The system as claimed in claim 16 wherein the encapsulation is formed with at least half of the pad having a conical shape in the encapsulation.

20. The system as claimed in claim 16 wherein:
the paddle external layer is surrounded by the pad external layer; and
the encapsulation is coplanar with the pad external layer.

* * * * *

UNITED STATES PATENT AND TRADEMARK OFFICE
CERTIFICATE OF CORRECTION

PATENT NO. : 8,404,524 B2  Page 1 of 1
APPLICATION NO. : 12/884073
DATED : March 26, 2013
INVENTOR(S) : Camacho et al.

It is certified that error appears in the above-identified patent and that said Letters Patent is hereby corrected as shown below:

In the Claims:

1. Column 9, Claim 1, line 6, delete "having pad" and insert therefor --having a pad--

2. Column 9, Claim 1, line 10, delete "wherein paddle" and insert therefor --wherein the paddle--

3. Column 9, Claim 1, line 11, delete "recess:" and insert therefor --recess;--

4. Column 9, Claim 3, line 27, delete "least had of" and insert therefor --least half of--

5. Column 9, Claim 6, line 44, delete "recess:" and insert therefor --recess;--

6. Column 9, Claim 6, line 52, delete "the inter" and insert therefor --the integrated circuit and--

7. Column 9, Claim 6, line 56, delete "coving" and insert therefor --covering--

8. Column 10, Claim 9, line 1, delete "wherein for min" and insert therefor --wherein forming the--

9. Column 10, Claim 11, line 19, delete "where the paddle" and insert therefor --wherein the paddle--

10. Column 10, Claim 11, line 20, delete "separated recess:" and insert therefor --separated by the recess;--

11. Column 10, Claim 11, line 23, delete "recess:" and insert therefor --recess;--

Signed and Sealed this
First Day of December, 2015

Michelle K. Lee
*Director of the United States Patent and Trademark Office*